United States Patent
Suh et al.

(10) Patent No.: US 9,324,382 B2
(45) Date of Patent: Apr. 26, 2016

(54) RESISTIVE MEMORY DEVICE CAPABLE OF IMPROVING SENSING MARGIN OF DATA

(71) Applicant: Samsung Electronics Co., Ltd., Suwon-si, Gyeonggi-do (KR)

(72) Inventors: Ki-Seok Suh, Hwaseong-si (KR); Jae-kyu Lee, Yongin-si (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 0 days.

(21) Appl. No.: 14/510,629

(22) Filed: Oct. 9, 2014

(65) Prior Publication Data

US 2015/0194200 A1 Jul. 9, 2015

(30) Foreign Application Priority Data

Jan. 3, 2014 (KR) .......... 10-2014-0000871

(51) Int. Cl.
*G11C 5/08* (2006.01)
*G11C 11/16* (2006.01)

(52) U.S. Cl.
CPC . *G11C 5/08* (2013.01); *G11C 11/16* (2013.01)

(58) Field of Classification Search
CPC ............. G11C 5/06; G11C 5/08; G11C 11/16
See application file for complete search history.

(56) References Cited

U.S. PATENT DOCUMENTS

| | | | |
|---|---|---|---|
| 5,694,369 A * | 12/1997 | Abe | .......... G11C 7/14 365/189.05 |
| 6,815,783 B2 | 11/2004 | Kim et al. | |
| 6,891,241 B2 | 5/2005 | Kim et al. | |
| 6,992,923 B2 | 1/2006 | Kim et al. | |
| 7,811,745 B2 * | 10/2010 | Ito | .......... G03F 7/0035 430/311 |
| 8,072,077 B2 | 12/2011 | Hwang | |
| 8,253,185 B2 | 8/2012 | Lee | |
| 8,530,309 B2 | 9/2013 | Lee | |
| 8,634,232 B2 | 1/2014 | Oh | |
| 2012/0045872 A1 | 2/2012 | Hwang | |

FOREIGN PATENT DOCUMENTS

| | | |
|---|---|---|
| EP | 1304738 A2 | 4/2003 |
| JP | 2004031617 A * | 1/2004 |
| KR | 101022666 B1 | 3/2011 |
| KR | 101037501 B1 | 5/2011 |
| KR | 1020120114056 A | 10/2012 |

\* cited by examiner

*Primary Examiner* — Harry W Byrne
*Assistant Examiner* — Lance Reidlinger
(74) *Attorney, Agent, or Firm* — Harness, Dickey & Pierce, P.L.C.

(57) ABSTRACT

A resistive memory device includes a cell block having a plurality of unit memory cells in which a resistive element and a cell select element are connected to each other in series, the cell block operating in response to a word line, a bit line, and a source line, and a dummy line, when different interconnection layers form the source line and the bit line, respectively, connected to one of the interconnection layers which is formed at a lower side the remaining interconnection layer between the interconnection layers for the source line and the bit line, wherein the dummy line has a resistance lower than a resistance of the lower interconnection layer.

20 Claims, 12 Drawing Sheets

RESISTIVE MEMORY DEVICE CAPABLE OF IMPROVING SENSING MARGIN OF DATA

CROSS-REFERENCE TO RELATED APPLICATION

This application claims priority under 35 U.S.C. §119 to Korean Patent Application No. 10-2014-0000871 filed on Jan. 3, 2014, the disclosure of which is hereby incorporated by reference in its entirety.

BACKGROUND

1. Field

Example embodiments of the inventive concepts relate to a semiconductor memory device, and more particularly, to a resistive memory device including a resistive element.

2. Description of Related Art

With development of a mobile system and various application systems, there has been an increasing need for non-volatile memories. The examples of next generation memory devices becoming increasingly popular include a phase change random access memory (PRAM) using a phase change material, a resistive random access memory (RRAM) using a variable resistance material, such as transition metal oxides, and a magnetic random access memory (MRAM) using a ferromagnetic material. These next generation memory devices have in common the fact that their resistances vary depending on an electric current or voltage, and even when the current or voltage is cut off, the resistance values are maintained so that refreshing the memory is not required because of their non-volatility.

The above described MRAM includes a magnetic upper electrode, a magnetic lower electrode, and a magnetic tunnel junction (MTJ) including a dielectric material between the upper and lower electrodes. Reading data from the MRAM can be achieved by determining a resistance state inside a certain cell caused by a tunneling magnetoresistance of the MTJ. Accordingly, in view of such a data read operation principle of the MRAM, which is based on the difference in resistance, resistance distribution management of the MRAM may be very important when improving the operation characteristics thereof.

SUMMARY

Example embodiments of the inventive concepts relate to a resistive memory device capable of increasing a data sensing margin.

The technical objectives of the inventive concepts are not limited to the above disclosure and other objectives may become apparent to those of ordinary skill in the art based on the following description.

In accordance with an example of the inventive concepts, a resistive memory device includes a cell block and a dummy line. The cell block may include a plurality of unit memory cells in which a resistive element and a cell select element are connected to each other in series, and operate in response to a word line, a bit line, and a source line. When different interconnection layers form the source line and the bit line, respectively, the dummy line may be connected to one of the interconnection layers that is formed at a lower side of the remaining interconnection layer between the interconnection layers for the source line and the bit line. The dummy line may have a resistance lower than a resistance of the lower interconnection layer.

In some example embodiments, the dummy line may correspond to an interconnection layer formed at an upper side of the lower interconnection layer, and may be disposed in parallel to the lower interconnection layer.

In another example embodiment, if the lower interconnection layer is the source line and the source line is disposed in parallel to the bit line, the dummy line may be a dummy bit line.

In another example embodiment, the source line may be electrically connected to the dummy bit line through a dummy contact formed at an edge of the cell block.

In another example embodiment, if the lower interconnection layer is the source line and the source line is disposed perpendicular to the bit line, the dummy line may be a dummy metal line.

In another example embodiment, the source line may be electrically connected to the dummy metal line through a dummy contact formed an edge of the cell block.

In another example embodiment, if the lower interconnection layer is the bit line and the source line is disposed perpendicularly to the bit line, the dummy line may be a dummy metal line.

In another example embodiment, the bit line may be electrically connected to the dummy metal line through a dummy contact formed at an edge of the cell block.

In accordance with another example of the inventive concepts, a resistive memory device includes a cell block, a dummy line, and a dummy contact. The cell block may include a plurality of unit memory cells in which a resistive element and a cell select element are connected to each other in series, and operate in response to a word line, a bit line, and a source line. The dummy line may be connected to one of several interconnection layers forming the source line and the bit line, respectively, the one interconnection layer formed prior to the remaining interconnection layers. The dummy contact may be formed at an edge of the cell block such that the one interconnection layer formed prior to the remaining interconnection layers is electrically connected to the dummy line.

In some example embodiments, if the one interconnection layer formed prior to the remaining interconnection layers is the source line, and the source line is disposed in parallel to the bit line, the dummy line may be a dummy bit line that is formed during a process of forming the bit line.

In another example embodiment, the bit line and the dummy bit line may have resistances that are lower than a resistance of the source line.

In another example embodiment, if the one interconnection layer formed prior to the remaining is the source line and the source line is disposed perpendicular to the bit line, the dummy line may be a dummy metal line that is formed during a process of forming an upper metal line.

In another example embodiment, the bit line and the dummy metal line may have resistances lower than a resistance of the source line.

In another example embodiment, if the one interconnection layer formed prior to the remaining interconnection layers is the bit line and the bit line is disposed perpendicular to the source line, the dummy line may be a dummy metal line that is formed during a process of forming an upper metal line.

In another example embodiment, the source line and the dummy metal line may have resistances that are lower than a resistance of the bit line.

At least one example embodiment relates to a resistive memory device including a cell array comprising a plurality of cell elements each including a plurality of interconnection layers, the plurality of interconnection layers including higher interconnection layers and lower interconnection layers, and a dummy line coupled to a higher interconnection layer or a lower interconnection layer via a dummy contact, wherein the dummy line has a lower resistance than the resistance of the higher or lower interconnection layer.

BRIEF DESCRIPTION OF THE DRAWINGS

The foregoing and other features and advantages of the inventive concepts will be apparent from the more particular description of example embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION

Figure 1A:
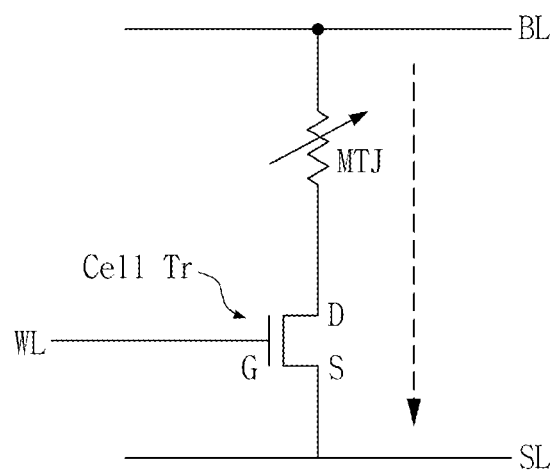
FIGS. 1A and 1B are views illustrating operations of a general resistive memory device.

Various example embodiments will now be described more fully with reference to the accompanying drawings in which some example embodiments are shown. These inventive concepts may, however, be embodied in different forms and should not be construed as limited to the example embodiments set forth herein. Rather, these example embodiments are provided so that this disclosure is thorough and complete and fully conveys the inventive concepts to those skilled in the art. In the drawings, the sizes and relative sizes of layers and regions may be exaggerated for clarity.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer or section from another region, layer or section. Thus, a first element, component, region, layer, or section discussed below could be termed a second element, component, region, layer, or section without departing from the teachings of the present inventive concepts.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly.

The terminology used herein is for the purpose of describing particular embodiments only and is not intended to be limiting of the present inventive concepts. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which this inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Meanwhile, when an embodiment is realized in a different way, functions or operations specified in a certain block may happen differently from the specified order. For example, sequential two blocks may be simultaneously implemented in practice, or depending on related functions or operations, may be implemented in an inverse order.

In the drawing figures, the dimensions of layers and regions may be exaggerated for clarity of illustration. Like reference numerals refer to like elements throughout. The same reference numbers indicate the same or components throughout the specification. Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Reference will now be made in detail to example embodiments, examples of which are illustrated in the accompanying drawings, wherein like reference numerals refer to the like elements throughout. In this regard, the example embodiments may have different forms and should not be construed as being limited to the descriptions set forth herein. Accordingly, the example embodiments are merely described below, by referring to the figures, to explain example embodiments of the present description.

Hereinafter, embodiments of the inventive concepts will be described with reference to the accompanied drawings.

Figure 1B:
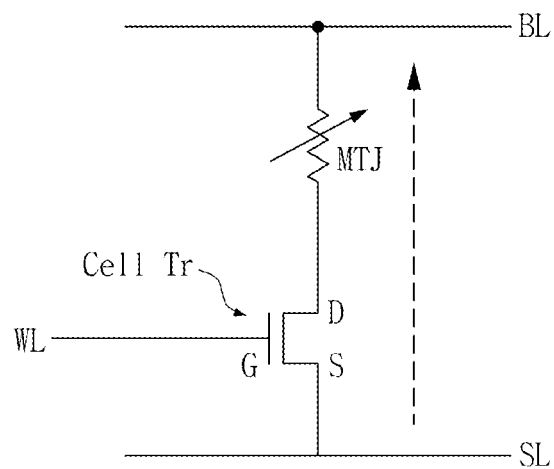

FIGS. 1A and 1B are circuit diagrams schematically illustrating operations of a unit cell of a general MRAM.

Referring to FIGS. 1A and 1B, the unit cell of a MRAM typically includes a cell select element Cell Tr and a resistive element (a magnetic tunnel junction: MTJ) coupled to the cell select element Cell Tr in series between a bit line BL and a source line SL.

The cell select element Cell Tr includes a gate G connected to a word line WL, a drain D coupled to the resistive element MTJ, and a source S coupled to a source line SL.

In addition, the resistive element MTJ is coupled between the drain D of the cell select element Cell Tr and the bit line BL. In general, the resistive element MTJ includes two magnetic layers (not shown) and a tunnel barrier layer (not shown) formed between the two magnetic layers. An upper layer (not shown) of the tunnel barrier layer has a magnetization direction varied with a direction of an electric current flowing through the resistive element MTJ, and a lower layer (not shown) of the tunnel barrier layer has a fixed magnetization direction. Based on such a configuration of the resistive element MTJ, a resistance value varies with the direction of a current, so that data "0" or "1" is recorded.

As for the simple description of an operation, during a data read or write operation, an electric current flows between the source line SL and the bit line BL through the resistive element MTJ according to a voltage applied through a selected word line WL.

Referring to FIG. 1A, when an electric current flows from the bit line BL to the source line SL, the upper layer of the tunnel barrier layer has a magnetization direction that is varied to be parallel to a fixed magnetization direction of the lower layer. Accordingly, a low resistance is formed on the resistive element MTJ, and "0" is stored in a corresponding cell.

On the other hand, referring to FIG. 1B, when an electric current flows from the source line SL to the bit line BL, the upper layer of the tunnel barrier layer has a magnetization direction that is varied to be anti-parallel to the fixed magnetization direction of the lower layer. Accordingly, a high resistance is formed on the resistive element MTJ, and "1" is stored in a corresponding cell.

A read operation can be achieved by detecting a difference in the amount of electric current flowing through the resistive element MTJ depending on the magnetization state of the resistive element MTJ.

As for a memory using such a resistive element, parasitic resistances need to be minimized except for the resistive element MTJ, to secure a sensing margin and prevent the operating voltage from being reduced.

Figure 2:
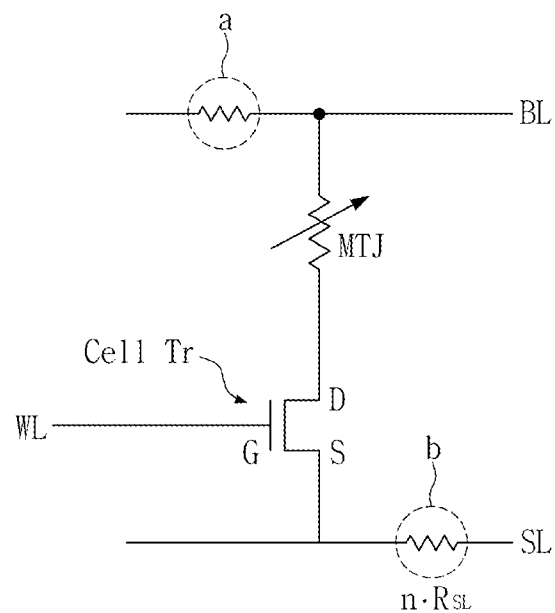
FIG. 2 is an equivalent circuit diagram illustrating resistances of a unit cell of a general MRAM.

FIG. 2 is an equivalent circuit diagram illustrating resistances of a unit cell of a general MRAM.

Referring to FIG. 2, the resistance (a) of the bit line BL and the resistance (b) of the source line SL are included in the resistances of the unit cell in addition to the resistance of the resistive element MTJ. Although not shown, the resistances of the unit cell may include resistance of the cell select element Cell Tr.

In general, when the source line SL is formed of an interconnection provided at a lower side of an interconnection forming the bit line BL, the source line SL, by nature of its processing order, may include tungsten (W), aluminum (Al), titanium nitride (TiN), or the like, which present less concerns regarding contamination issues. In addition, since the bit line BL is formed through a back-end line process, the bit line BL may be formed using copper (Cu), having a low resistance material through a damascene process.

Depending on the material forming the bit line BL and the source line SL, the specific resistance of one of the source line SL and the bit line BL may be 10 times or more than the other one of the source line SL and the bit line BL. As described above, the MRAM may represent two states of data based on the difference in resistances applied to both ends of the resistive element MTJ according to density and direction of a current applied to the MRAM. However, due to the large difference in specific resistance between the bit line BL and the source line SL, the sensing margin of data may be reduced. That is, lengths of the source line SL and the bit line BL vary with the position of a cell, and in this case, such a large difference in specific resistance between the source line SL and the bit line BL may cause the amount of current applied to the resistive element MTJ, after passing the source line SL and the bit BL, to be different, and thus the sensing margin of data may be reduced while lowering the distribution of data.

In this regard, there has been a suggestion that a termination end of the source line SL is formed to be higher to reduce resistance of the source line SL. However, this method may cause a drawback of increasing heights involving other processes. In addition, there has been another suggestion that a copper layer is added in a back end process, and is connected to the source line SL in a strapping structure. In this case, a trimming process of the resistive element MTJ needs to be added because a contact between resistive elements MTJ is formed, and distribution of critical dimension (CD) of the resistive element MTJ is increased, the processing complexity is increased, and additional cost for the layer is incurred due to the trimming process.

Figure 3:
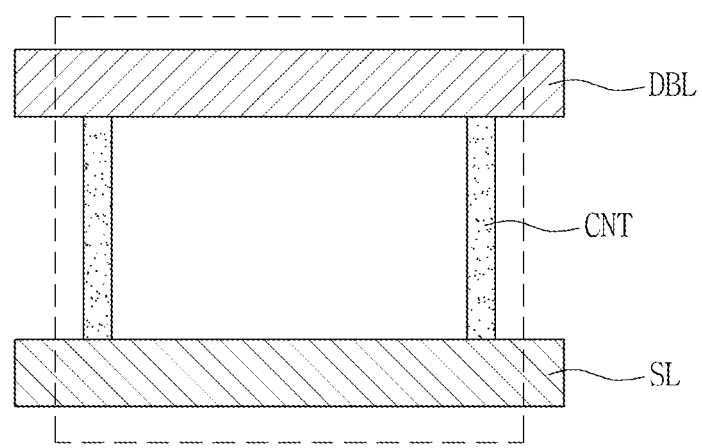
FIG. 3 is a schematic cross sectional view showing a relation between a dummy bit line and a source line in accordance with an example embodiment of the inventive concepts.

FIG. 3 is a schematic cross sectional view showing a relationship between a dummy bit line and a source line in accordance with at least one example embodiment of the inventive concepts.

Referring to FIG. 3, a source line SL is electrically connected to a dummy bit line DBL through a dummy contact CNT.

The word line WL and the bit line BL may be disposed at a predetermined, or alternatively, desired angle with respect to each other, for example, at an angle of about 90 degrees. In addition, the bit line BL and the source line SL may be disposed in parallel to each other.

According to at least one example embodiment, when the bit line BL is formed of an interconnection provided at an upper side of an interconnection forming the source line SL, a dummy bit line DBL is formed within a predetermined, or alternatively, desired pitch of the bit lines BL, and the dummy bit line DBL is electrically connected to the source line SL through the dummy contact CNT. The dummy bit line is formed at the same time as, or contemporaneously, when the bit line BL is formed, and thus the burden of having an addition process is alleviated. In addition, the dummy bit line has the same line width as that of the bit line BL, so that placement efficiency is enhanced.

According to at least one example embodiment, the electrical connection between the dummy bit line DBL and the source line SL does not need to be formed at regular pitches within a cell, and can only be formed at edges of the cell block. According to inventive concepts, the path of an electric current flowing through the source line SL may be increased without exerting an influence on the repeatability of the existing cells and the electrical states between the cells, unlike when the strapping is performed at equal intervals.

Figure 4:
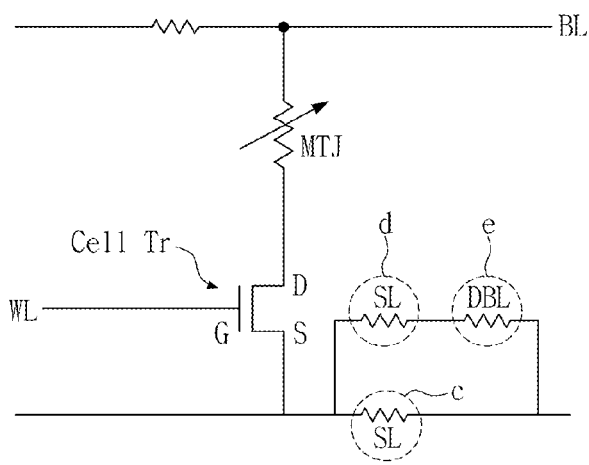
FIG. 4 is an equivalent circuit diagram that reflects electrical resistance of FIG. 3.

FIG. 4 is an equivalent circuit diagram that reflects the electrical resistance of FIG. 3.

Referring to FIG. 4, a dummy bit line DBL is connected to a source line SL, so that parallel connection of resistances of the source line SL is achieved, and at the same time or contemporaneously, the path of a current of the source line SL is increased. In addition, the connection of the dummy bit line DBL having a specific resistance lower than the specific resistance of the source line SL enables the electric resistance to be lowered.

When the number of cells in a unit cell block is 1024, an $n^{th}$ select source line SL has a resistance c, an opposite side source line SL connected through the dummy bit line DBL has a resistance d, and the dummy bit line DBL has a resistance e that is applied to all of the 1024 cells, a resistance applied to the $n^{th}$ source line SL is expressed as Equation 1.

$$R = \frac{1}{\frac{1}{c} + \frac{1}{(d+e)}} \quad \text{[Equation 1]}$$

Equation 1 may be expressed as Equation 2 below.

$$R = \frac{1}{\frac{1}{n*R_{SL}} + \frac{1}{(1024-n)*R_{SL}+1024*R_{BL}}} \quad \text{[Equation 2]}$$

That is, the path of an electric current of the selected present source line and the path of an electric current at the opposite side to the selected position add up, so that an increased path of the electric current can be achieved and the parallel connection in resistance leads to the resistance of the selected source line being reduced.

Figure 5A:
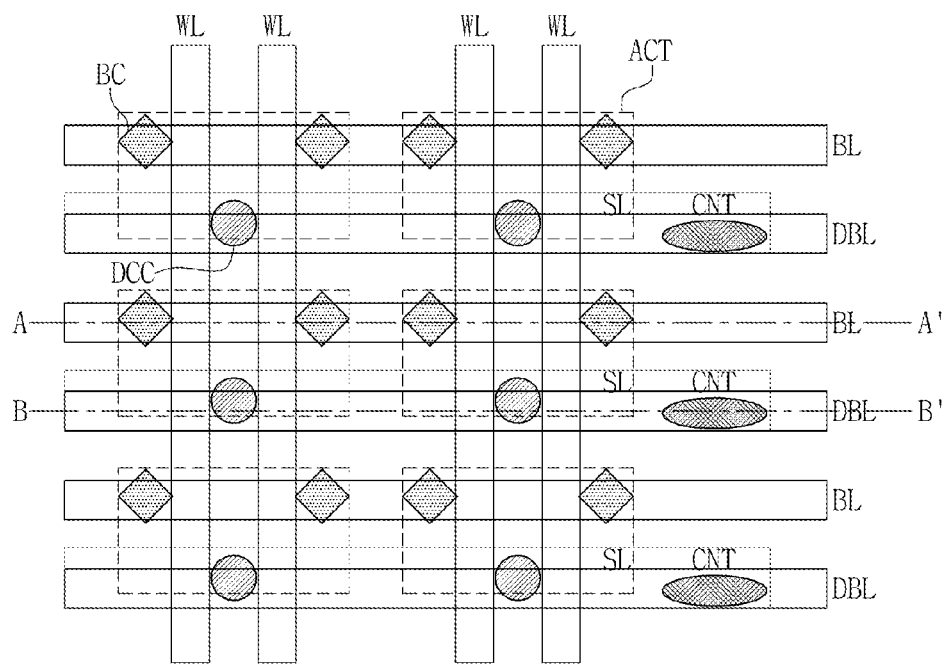
FIG. 5A is a layout view and FIGS. 5B and 5C are cross sectional views, illustrating an example embodiment of the inventive concepts.
Figure 5B:
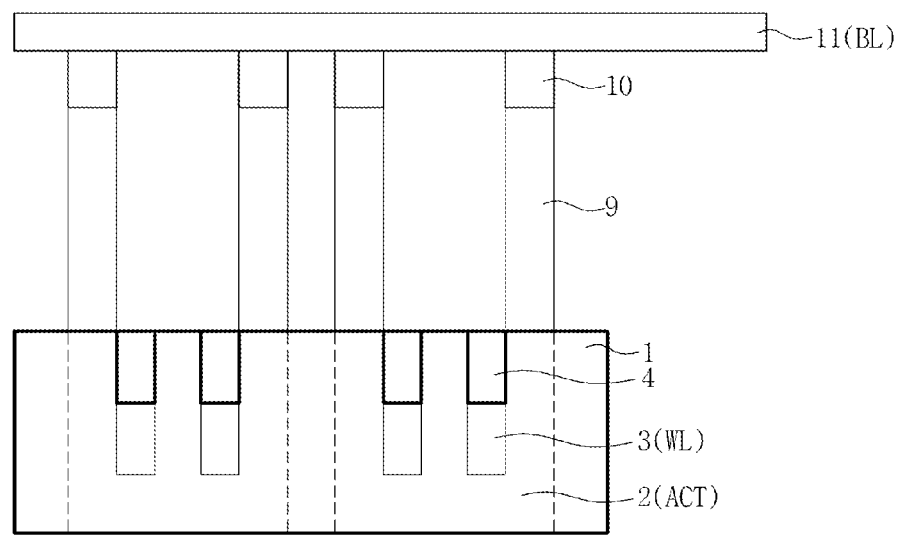
Figure 5C:
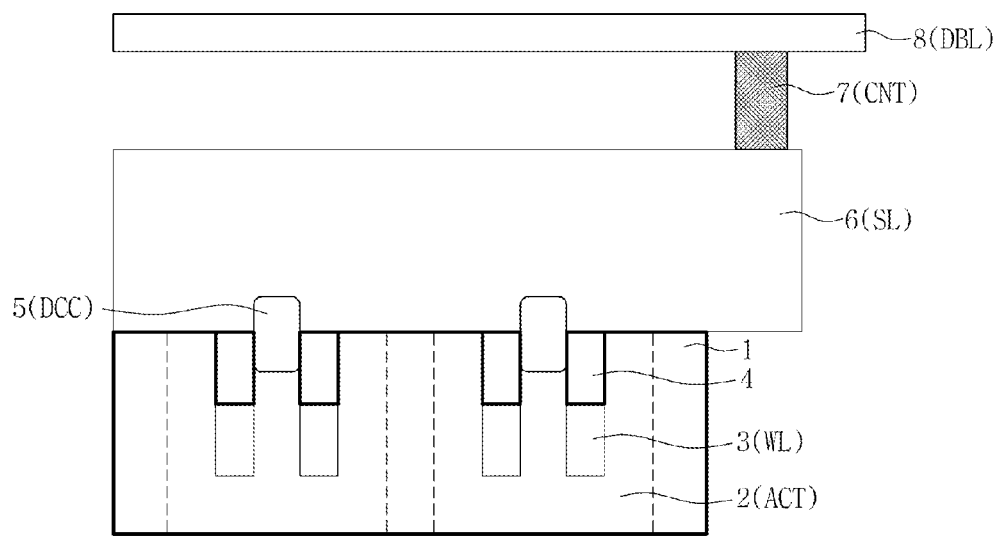

FIG. 5A is a layout view and FIGS. 5B and 5C are cross sectional views, illustrating an example embodiment of the inventive concepts.

FIGS. 5A to 5C illustrate a portion of an edge of a cell block including a plurality of unit memory cells, each memory cell having a resistive element connected to a cell select element in series, and operating in response to the word line WL, the bit line BL, and the source line SL. In the following description, when different interconnection layers are formed by the source line SL and the bit line BL, respectively, the dummy line is connected to one of the interconnection layers which is formed at a lower side of the remaining interconnection layer between the interconnection layers for the source line and the bit line. The dummy line may have a lower resistance than the resistance of the lower side interconnection layer.

Referring to FIG. 5A, different interconnection layers form the source line SL and the bit line BL, respectively, and the source line SL and the bit line BL, are disposed in parallel to each other in the same direction.

Referring to FIG. 5A, a resistive element MTJ and a cell select element Cell Tr are formed on a region defined as an active area ACT, and the resistive element MTJ and the cell select element Cell Tr are connected to each other in series on the bit line BL, and a word line WL is disposed on a gate terminal G of the cell select element.

Word lines WL extend in a first direction while being disposed at an interval from each other. The bit lines BL extend in a second direction perpendicular to the word lines WL while being disposed at an interval from each other. The source lines SL are disposed while extending in the same direction as that of the bit lines BL.

According to at least one example embodiment, the active area ACT is connected to the bit line BL through a bottom contact BC and the resistive element MTJ.

The active area ACT may be connected to the source line SL through a direct contact DCC.

In accordance with an example embodiment of the inventive concepts, the dummy bit line DBL is connected to the source line SL through a dummy contact CNT.

The dummy bit line DBL is formed between the bit lines BL since the source line SL and the bit line BL are alternately disposed, and the bit lines BL have a larger pitch than the pitch of the source lines SL by a predetermined, or alternatively, desired difference.

Accordingly, the connection of the dummy bit line DBL having a resistance that is lower than the resistance of the source line SL leads to the resistance being reduced and the path of resistance being increased, so that the operation of the resistive memory device is improved.

FIG. 5B is a longitudinal sectional view taken along line A-A' of FIG. 5A, and FIG. 5C is a longitudinal sectional view taken along line B-B' of FIG. 5A.

In FIG. 5B, a longitudinal section of a lower side of an existing bit line BL is shown, according to at least one example embodiment.

An element isolation layer 1 is formed to define an active area ACT 2 on a semiconductor substrate.

A word line WL 3 is formed within the active area 2, and an insulation layer 4 is buried between the word line WL and the element isolation layer 1.

A bottom contact BC 9 is formed at an upper side of a drain in the active area 2, and a resistive element MTJ 10 is formed on the bottom contact BC.

A bit line BL 11 is formed at an upper side of the resistive element MTJ 10.

That is, at a lower side of the existing bit line BL, the resistive element MTJ connected to a cell select element in series is formed.

In FIG. 5C, a longitudinal section taken along line B-B' in accordance with an example embodiment of the inventive concepts is shown, in which the element isolation layer1 is formed to define the active area ACT 2 in the semiconductor substrate.

The word line WL 3 is formed within the active area 2, and the insulation layer 4 is buried between the word line WL and the element isolation layer 1.

A direct contact DCC 5 is formed at an upper side of a source in the active area 2 and is electrically connected to a source line SL.

Meanwhile, a dummy bit line DBL is formed at an upper side of the source line SL, and the dummy bit line DBL is connected to the source line SL through a dummy contact CNT.

In accordance with an example embodiment of the inventive concepts, an electric current is supplied through a dummy bit line DBL having a lower resistance value than a source line SL into a resistive element MTJ of a selected cell, and thus a difference in resistance between cells that is caused by the source line SL is reduced regardless of the position of a cell, when compared to a case in which a current is supplied only through the source line SL. That is, a difference in resistance between a cell located adjacent to a periphery circuit (not shown) and a cell located distant from the periphery circuit which is caused by a source line SL is significantly reduced. Accordingly, resistance applied to the source line SL is reduced, so that the difference in resistance according to the positions of the cell becomes smaller than according to conventional technology.

The above described concepts may be applied in a way that reduces resistance of a source line SL by use of a dummy metal line when the bit line BL and the source line SL are not disposed in parallel to each other but perpendicular to each other.

Figure 6A:
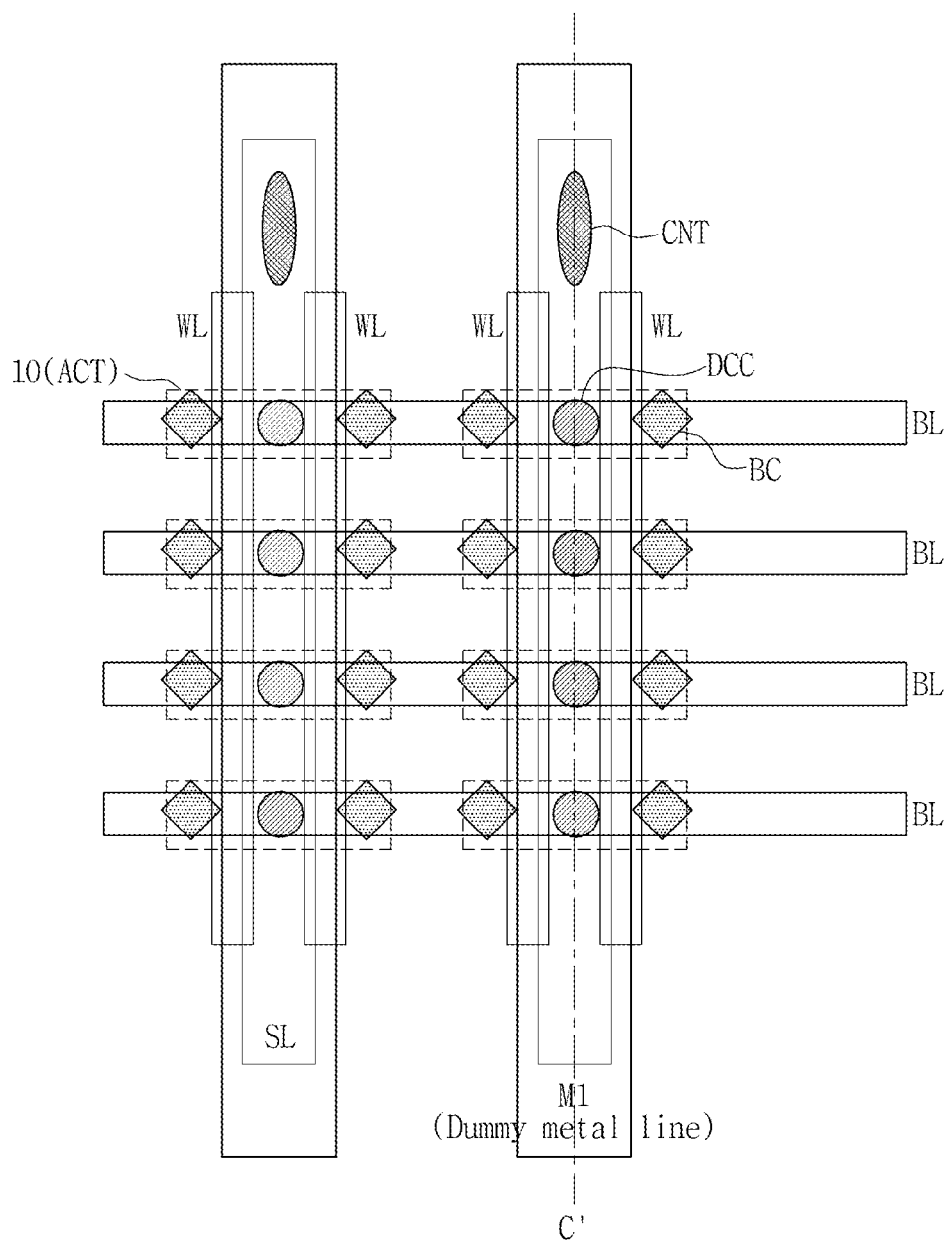
FIG. 6A is a layout view and FIG. 6B is a cross sectional view, illustrating another example embodiment of the inventive concepts.
Figure 6B:
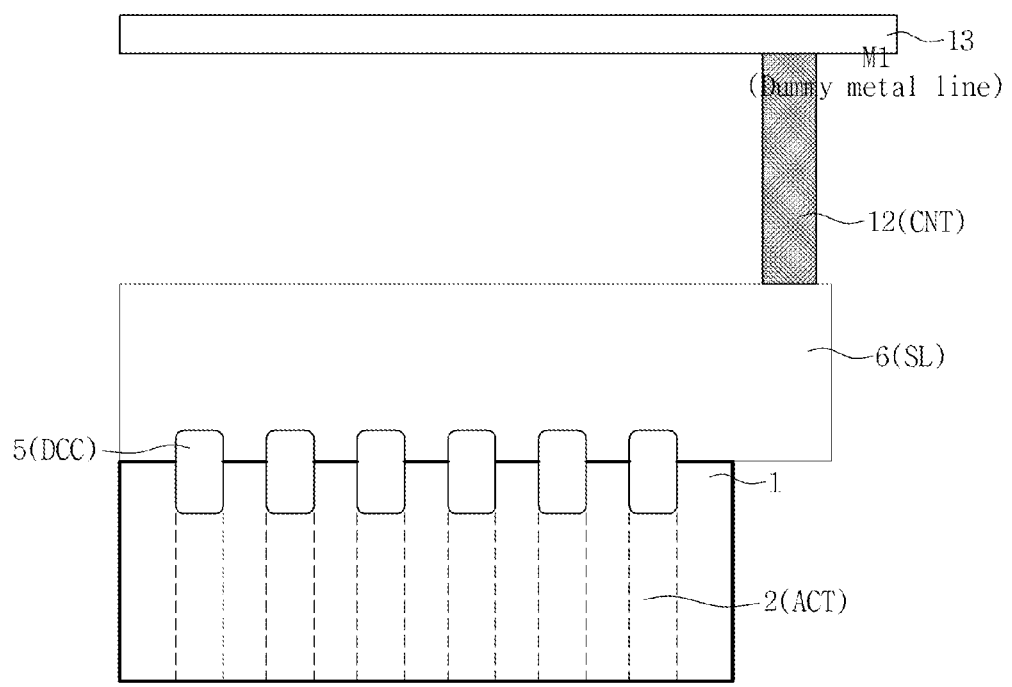

FIG. 6A is a layout view and FIG. 6B is a cross sectional view, illustrating another example embodiment of the inventive concepts in which resistance of a source line SL is reduced when a bit line BL is disposed perpendicularly to a source line SL.

The following description in FIG. 6A will be made in relation to parts that are different from those illustrated in FIG. 5A while omitting the details of parts identical to those of the previous example embodiment.

Referring to FIG. 6A, a resistive element MTJ and a cell select element Cell Tr are formed on a region defined as an active area ACT, and the resistive element MTJ and the cell select element Cell Tr are connected to each other in series between the bit line BL and the source line SL, and a word line WL is disposed on a gate terminal G of the cell select element Tr.

According to at least one example embodiment, word lines WL extend in a first direction while being disposed at an interval from each other. The source lines SL extend in parallel to the word lines WL.

The bit lines BL may be disposed at an interval from each other in a second direction perpendicular to the word lines WL. The active area ACT is connected to the bit line BL through a bottom contact BC and a resistive element MTJ.

The active area ACT is connected to the source line SL through a direct contact DCC.

In accordance with an example embodiment of the inventive concepts, a dummy metal line M1 is connected to the source line SL through a dummy contact CNT. The dummy metal line M1 may be formed as an interconnection provided at an upper side of an interconnection forming the bit line BL.

As described above, when a bit line BL is disposed perpendicularly to the source line SL, the dummy metal line M1 disposed in parallel to the source line SL, while formed at an upper side of the source line SL, is used so as to provide an easy electrical connection to the source line SL which is a lower side interconnection.

FIG. 6B is a longitudinal sectional view taken along line C-C' of FIG. 6A.

According to at least one example embodiment, an element isolation layer 1 is formed to define an active area ACT 2 on a semiconductor substrate.

A direct contact DCC 5 is formed at an upper side of a source in the active area 2 so as to be electrically connected to a source line SL.

Meanwhile, a dummy metal line M1 is formed at an upper side of the source line SL, and the dummy metal line M1 is connected to the source line SL through a dummy contact CNT.

The dummy metal line M1 is formed in the same process as a metal line. The metal line may be a signal interconnection or a power interconnection. That is, since an electric connection is made by use of the dummy metal line M1 formed as dummy, that is, by use of a metal line having a specific resistance lower than the specific resistance of the source line SL, the resistance of the source line SL is reduced and thus the sensing margin of data is improved.

The inventive concepts are not limited thereto, and may be applied to a case in which a bit line BL is formed as an interconnection provided at a lower side of an interconnection forming a source line SL.

Hereinafter, still another example embodiment of the inventive concepts will be described with reference to drawings.

Figure 7A:
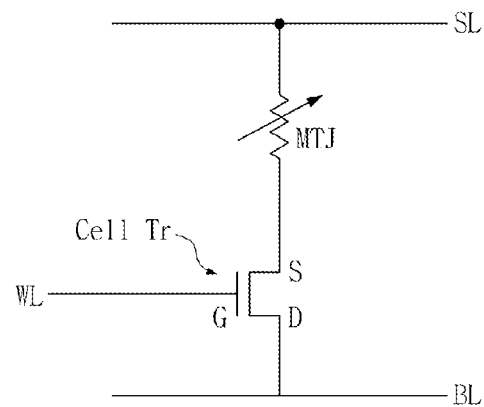
FIGS. 7A, 7B, and 7C represent an equivalent circuit diagram, a layout view, and a cross sectional view, illustrating another example embodiment of the inventive concepts.

FIG. 7A illustrates a case in which a source line SL is connected to a resistive element MTJ, unlike FIG. 1A. Referring to FIG. 7A, a unit cell of an MRAM includes a cell select element Cell Tr and a resistive element MTJ connected to the cell select element Cell Tr in series between a bit line BL and a source line SL, similarly to the unit cell shown in FIG. 1A.

In addition, the cell select element Cell Tr includes a gate terminal G connected to a word line WL, a source S connected to the resistive element MTJ, and a drain D connected to the bit line BL.

However, the resistive element MTJ is connected between the source S of the cell select element Cell Tr and the source line SL.

Figure 7B:
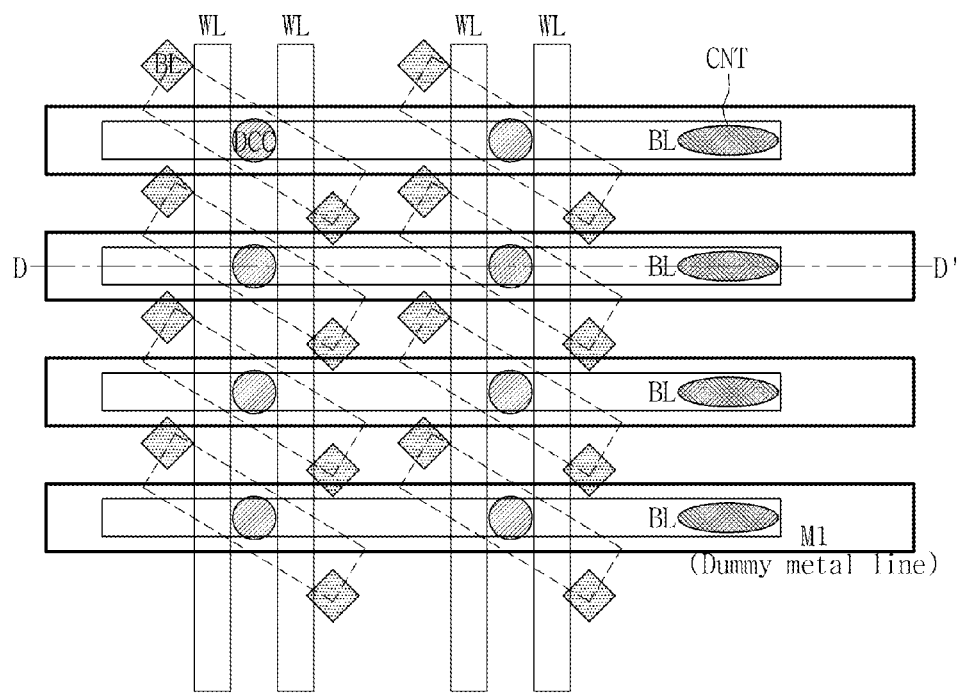
Figure 7C:
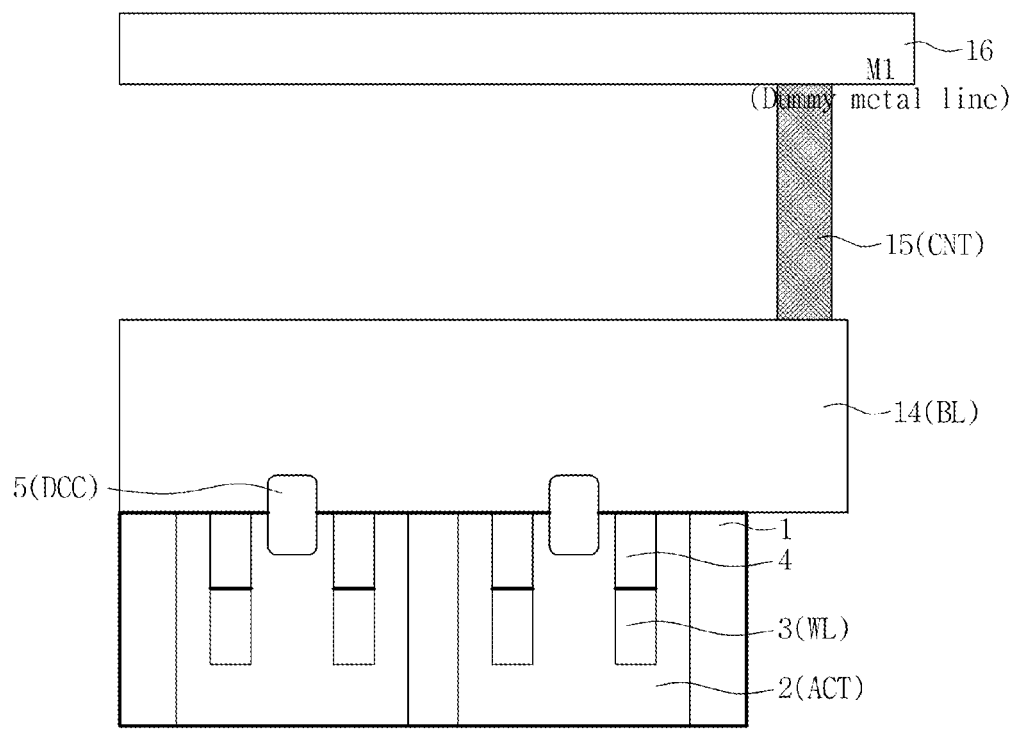

Referring to FIGS. 7B and 7C, a lower interconnection layer forms a bit line BL, and a source line SL is disposed perpendicularly to the bit line BL, and a dummy line is a metal line.

Referring FIG. 7B, a resistive element MTJ and a cell select element Cell Tr are formed on a region defined as an active area ACT, and the resistive element MTJ is connected to the cell select element Cell Tr in series between the bit line BL and the source line SL, and the word line WL is disposed on a gate terminal G of the cell select element Cell Tr.

According to at least one example embodiment, the word lines WL extend in a first direction while being disposed at an interval from each other. The bit lines BL are disposed at an interval from each other in a second direction perpendicular to the word lines WL. For convenience's sake of description, the source lines SL are not illustrated.

The active area ACT is connected to the source line SL (not shown) through a bottom contact BC and the resistive element MTJ.

The active area ACT is connected to the bit line BL through a direct contact DCC.

The active area ACT is illustrated as being disposed at an oblique angle to prevent the bit line BL from contacting the bottom contact BC. However, the inventive concepts are not limited thereto, and the active area ACT may be provided at various angles.

Since a dummy metal line M1 extends in the same direction as the direction of the bit line BL, the dummy metal line M1 is connected to the bit line BL through a dummy contact CNT in accordance with an example embodiment of the inventive concepts.

In FIG. 7C, a longitudinal section taken along line D-D' in accordance with an example embodiment of the inventive concepts is shown, in which an element isolation layer 1 is formed to define an active area ACT 2 in a semiconductor substrate.

A word line WL 3 is formed within the active area 2, and an insulation layer 4 is buried between the word line WL and the element isolation layer 1.

A direct contact DCC 5 is formed at an upper side of a drain in the active area 2 and is electrically connected to a bit line BL.

Meanwhile, a dummy metal line M1 is formed on the bit line BL, and the dummy metal line M1 is connected to the bit line BL through a dummy contact CNT.

In accordance with example embodiments of the inventive concepts, a lower interconnection layer that needs to be formed using a material having a specific resistance that is higher than the specific resistance of an upper interconnection layer is connected to a dummy line so that the resistance of the lower interconnection layer is reduced.

For example, if a source line SL is a lower interconnection that needs to be formed earlier than a bit line BL, the source line is connected by use of a dummy line of a bit line BL parallel to the source line SL, or a dummy line of a metal line M1 parallel to the source line SL through a dummy contact CNT. Accordingly, the path of a current of the source line SL is increased while connecting resistances in parallel, so that the resistance of the source line SL is reduced.

If a bit line BL is an interconnection that needs to be formed earlier than a source line SL, the bit line is electrically connected by use of a dummy line of a metal line M1 parallel to the bit line BL, thereby reducing resistance of the lower interconnection layer. In addition, the electrical connection may be implemented by use of another metal line that may be formed at an upper side of the above described metal line.

As described above, in order to reduce the sensing margin of data when a lower interconnection layer (a bit line or a source line) has a high resistance, the difference in resistance of a resistive element MTJ is reduced. However, according to the inventive concepts, a factor of reducing difference in resistance of the resistive element MTJ is diminished so that the sensing margin of data is improved, and the critical dimension (CD) distribution of data is improved.

In addition, a dummy contact for an electrical connection is formed only at both ends of a cell block, for example, edges of a predetermined, or alternatively, desired area without requiring an additional area for the dummy contact. Accordingly, the cell block may maintain the same pitch as in the conventional technology. In addition, a dummy line is formed at the same time, or contemporaneously, when a bit line BL or a metal line M1 is formed, without performing an additional process for the dummy line, thereby reducing manufacturing costs or steps.

Figure 8:
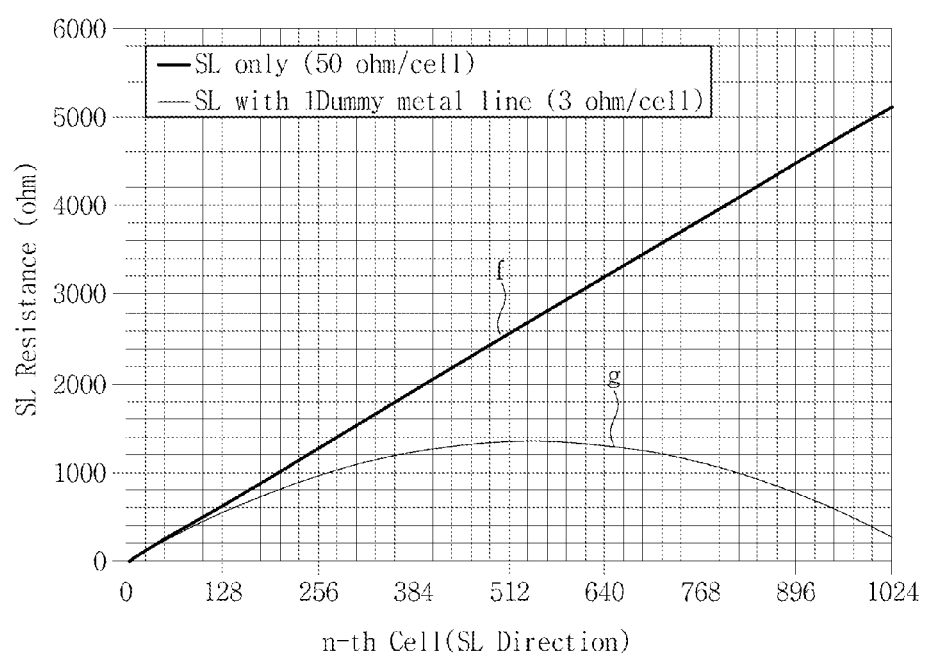
FIG. 8 is a graph showing a change in resistance according to positions of cells when a conventional technology is compared with an example embodiment of the inventive concepts.

FIG. 8 is a graph showing a difference in resistance between a conventional source line and a source line of an experimental example of the inventive concepts.

Referring to FIG. 8, the X axis represents the positions of cells, and the Y axis represents resistance, showing a change in resistance according to the position of a cell. f is a graph representing a change in resistance of a conventional source line SL, and g is a graph representing a change in resistance of a source line SL according to an example of the inventive concepts.

For example, when a conventional source has a resistance of 50 Ω/cell, a source line may have a maximum resistance of about 50 kΩ depending on the position of the source line (see the cell position of the $1024^{th}$ cell in graph f).

Meanwhile, when both ends of a source line SL are connected to a dummy bit line DBL according to an example embodiment of the inventive concepts and the dummy bit line DBL has a resistance of 3 Ω/cell, the maximum effective resistance of the source line SL may be reduced to about 13 kΩ according to Equations 1 and 2 (see the cell position of a $512^{th}$ cell).

Therefore, the source line in accordance with an example embodiment of the inventive concepts has exhibits about a 70% decrease in resistance when compared to a conventional source line.

That is, in accordance with the embodiment of the inventive concepts, a dummy contact is formed at an edge of a cell block by use of a dummy line and is connected to a source line or a bit line, so that the resistance of a lower interconnection is lowered.

In addition, a dummy contact is not formed within a cell array or a cell block, which enables the cell array of a resistive element MTJ to be maintained, an additional area is thus not required and an influence on an area distribution of the resistive element MTJ is therefore reduced.

Further, unlike a strapping process performed at a predetermined, or alternatively, desired pitch, the dummy contact is formed at edges of both ends of a cell block, so that the complexity of the manufacturing process is lowered.

Figure 9:
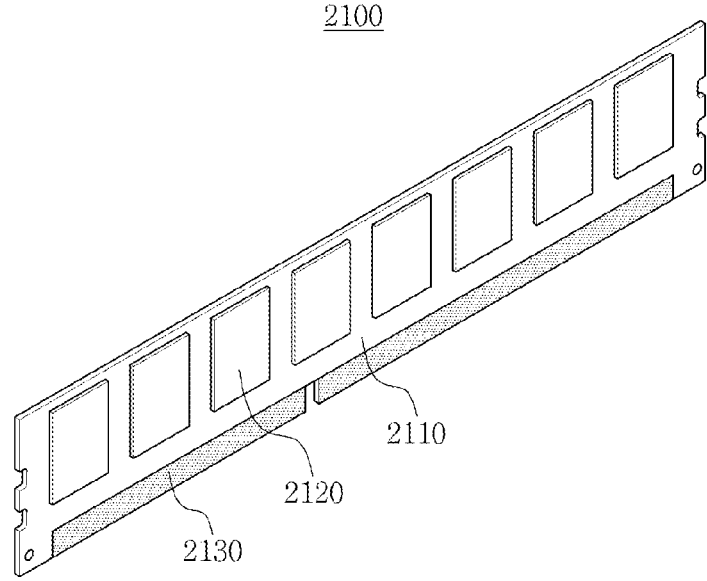
FIG. 9 is a view illustrating a memory module 2100 including a resistive memory device in accordance with example embodiments of the inventive concepts.

FIG. 9 is a view illustrating a memory module 2100 including a resistive memory device in accordance with at least one example embodiments of the inventive concepts.

Referring to FIG. 9, the memory module 2100 includes a printed circuit board 2110, a plurality of MRAM memory chips 2120, and a connector 2130. The plurality of MRAM memory chips 2120 may be coupled to an upper surface and a lower surface of the printed circuit board 2110. The connector 2130 is electrically connected to the plurality of MRAM memory chips 2120 through wirings (not shown). In addition, the connector 2130 may be connected to a slot of an external host.

Figure 10:
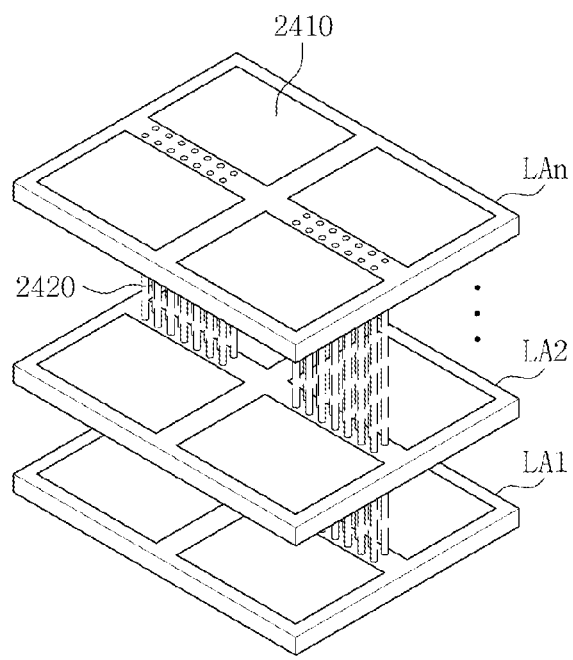
FIG. 10 is a schematic view illustrating a stacked type semiconductor device provided with a plurality of semiconductor layers.

FIG. 10 is a schematic view illustrating a stacked type semiconductor device provided with a plurality of semiconductor layers. Each of the memory chips in a module structure of FIG. 9 may be provided with a plurality of semiconductor layers LA1 to LAn shown in FIG. 10.

The plurality of semiconductor layers LA1 to LAn having a stacked structure in a memory chip 2400 are connected to one another through a through silicon via (TSV) 2420. Each semiconductor layer may include cell arrays 2410 including a spin transfer torque (STT)-MRAM cell.

Figure 11:
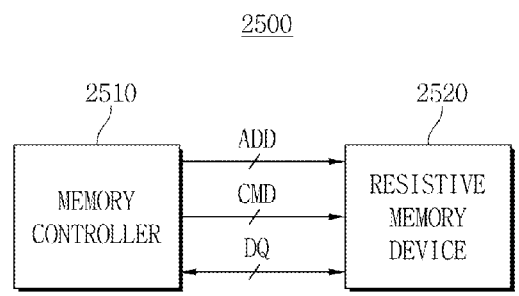
FIG. 11 is a block diagram illustrating a memory system 2500 including a resistive memory device in accordance with an example embodiment of the inventive concepts.

FIG. 11 is a block diagram illustrating a memory system 2500 including a resistive memory device in accordance with an example embodiment of the inventive concepts.

Referring to FIG. 11, the memory system 2500 includes a memory controller 2510 and a semiconductor memory device 2520.

The memory controller 2510 generates an address signal ADD and a command CMD, and provides the address signal ADD and the command CMD to the semiconductor memory device 2520 through a bus. Data DQ is transmitted from the memory controller 2510 to the semiconductor memory device 2520 through the bus, or transmitted from the semiconductor memory device 2520 to the memory controller 2510 through the bus.

The semiconductor memory device 2520 may be a resistive memory device in accordance with an example embodiment of the inventive concepts, and may compensate for resistance distribution by controlling a boundary state of a cell transistor.

Figure 12:
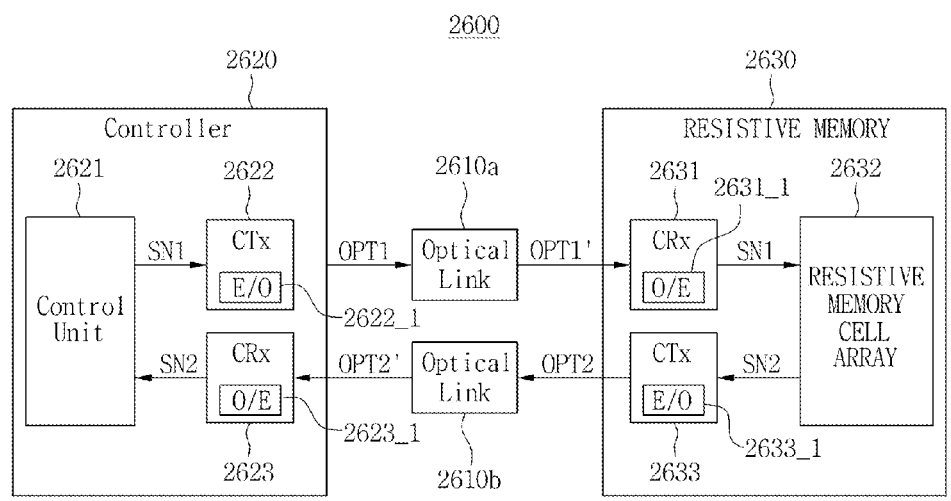
FIG. 12 is a view illustrating an example embodiment of a memory system including an optical link.

FIG. 12 is a view illustrating an example embodiment of a memory system including an optical link. Referring to FIG. 12, a memory system 2600 includes a controller 2620, a resistive memory device 2630, and a plurality of optical links 2610a and 2610b interconnecting the controller 2620 to the resistive memory device 2630. The controller 2620 includes a control unit 2621, a first transmission unit 2622, and a first reception unit 2623. The control unit 2621 transmits a control signal SN1 to the first transmission unit 2622.

The first transmission unit 2622 may include a first optical modulator 2622_1, and the first optical modulator 2622_1 may convert the control signal SN1, which is an electric signal, into a first optical transmission signal OPT1 and transmits the converted first optical signal OPT1 to the optical link 2610a.

The first reception unit 2623 may include a first optical demodulator 2623_1. The first optical demodulator 2623_1 converts a second optical reception signal OPT2' received from the optical link 2610b into a data signal SN2, which is an electric signal, and transmits the converted data signal SN2 to the control unit 2621.

The resistive memory device 2630 includes a second reception unit 2631, a resistive memory cell array 2632, and a second transmission unit 2633. The second reception unit 2631 may include a second optical demodulator 2631_1, and the second optical demodulator 2631_1 converts a first optical reception signal OPT1 from the optical link 2610a into a control signal SN1, which is an electric signal, and transmits the converted control signal SN1 to the resistive memory cell array 2632. The resistive memory cell array 2632 writes data according to control of the control signal SN1, and transmits a data signal SN2 to the second transmission unit 2633.

The second transmission unit 2633 may include a second optical modulator 2633_1, and the second optical modulator 2633_1 converts the data signal SN2 received from the resistive memory cell array 2632 and corresponding to an electric signal into a second optical data signal OPT2, and transmits the converted second optical data signal OPT2 to the optical link 2610b.

Figure 13:
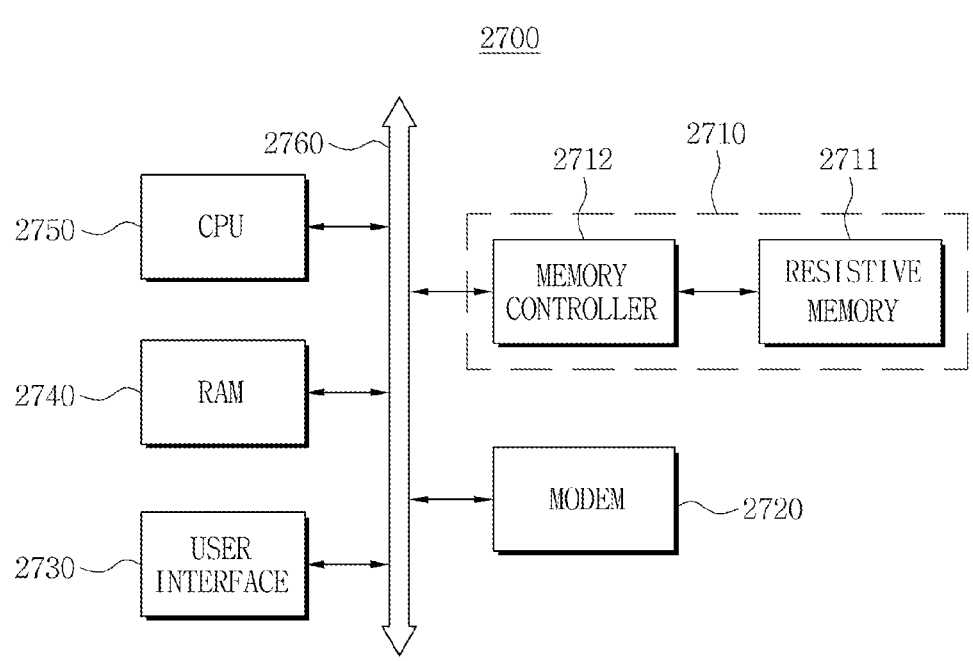
FIG. 13 is a block diagram illustrating an information processing system 2700 on which a memory device in accordance with inventive concepts is mounted.

FIG. 13 is a block diagram illustrating an example of an information processing system 2700 having a memory device in accordance with the inventive concepts.

Referring to FIG. 13, the information processing system 2700 has a semiconductor memory device 2711 mounted thereon. The information processing system 2700 may include a memory system 2710 electrically connected to a system bus 2760, a modem 2720, a central processing unit (CPU) 2750, a random access memory (RAM) 2740, and a user interface 2730.

The memory system 2710 may include a resistive memory device 2711 and a memory controller 2712. The resistive memory device 2711 stores data that is processed by the CPU 2750 or data input from outside.

A semiconductor memory device including a resistive memory cell may be applied to at least one of the resistive memory device 2711 and the RAM 2740. That is, a semiconductor memory device including an STT-MRAM cell may be applied to the resistive memory device 2711 storing a great amount of data or the RAM 2740 that stores data to which a fast access needs to be made, for example system data. Although not shown in FIG. 13, it is obvious to the skilled in the art that the information processing system 2700 may further include an application chipset, a camera image processor, and input/output devices.

The STT-MRAM among the resistive memory devices is a next generation memory having characteristics of a low cost and a high capacity of a dynamic random-access memory (DRAM), an operating speed of a static random-access memory (SRAM), and non-volatility of a flash memory. While a conventional system in which a cache memory and a RAM that have high processing speeds are separately provided from a storage storing a great amount of data, the MRAM device in accordance with the inventive concepts can be substituted for the above described memories. That is, the memory device including an MRAM can store a great amount of data at a high speed, so that the computer system architecture can be simplified.

As can be seen from the foregoing, the resistive memory device uses a dummy line to reduce the resistance of a source line or a bit line, thereby improving the distribution of resistance and thus improving the sensing margin of data.

The inventive concepts may be applied to a memory device, in particular, to a resistive memory device and a memory system including the same.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of the inventive concepts as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other embodiments, are intended to be included within the scope of the appended claims.

What is claimed is:

1. A resistive memory device comprising:
a cell block comprising a plurality of unit memory cells in which a resistive element and a cell select element are connected to each other in series, the cell block being configured to operate in response to a word line, a bit line, and a source line; and
a dummy line, when different interconnection layers are configured to form the source line and the bit line, connected to one of the interconnection layers formed at a lower side of a remaining interconnection layer, the remaining interconnection layer being between the interconnection layers forming the source line and the bit line,
wherein the dummy line has a lower resistance than a resistance of the lower interconnection layer.

2. The resistive memory device according to claim 1, wherein the dummy line corresponds to an interconnection layer formed at an upper side of the lower interconnection layer, and is disposed in parallel to the lower interconnection layer.

3. The resistive memory device according to claim 2, wherein when the lower interconnection layer is the source line and the source line is in parallel to the bit line, the dummy line is a dummy bit line.

4. The resistive memory device according to claim 3, wherein the source line is electrically connected to the dummy bit line through a dummy contact formed at an edge of the cell block.

5. The resistive memory device according to claim 2, wherein when the lower interconnection layer is the source line and the source line is perpendicular to the bit line, the dummy line is a dummy metal line.

6. The resistive memory device according to claim 5, wherein the source line is electrically connected to the dummy metal line through a dummy contact formed at an edge of the cell block.

7. The resistive memory device according to claim 2, wherein when the lower interconnection layer is the bit line and the source line is perpendicular to the bit line, the dummy line is a dummy metal line.

8. The resistive memory device according to claim 7, wherein the bit line is electrically coupled to the dummy metal line through a dummy contact formed at an edge of the cell block.

9. A resistive memory device comprising:
a cell block comprising a plurality of unit memory cells in which a resistive element and a cell select element are connected to each other in series, the cell block being configured to operate in response to a word line, a bit line, and a source line;
a dummy line connected to one of a plurality of interconnection layers forming the source line and the bit line, respectively, the one interconnection layer formed prior to remaining interconnection layers; and
a dummy contact formed at an edge of the cell block such that the one interconnection layer formed prior to the remaining interconnection layers is electrically connected to the dummy line.

10. The resistive memory device according to claim 9, wherein when the one interconnection layer formed prior to the remaining interconnection layers is the source line, and the source line is disposed in parallel to the bit line, the dummy line is a dummy bit line.

11. The resistive memory device according to claim 10, wherein the bit line and the dummy bit line have resistances that are lower than a resistance of the source line.

12. The resistive memory device according to claim 9, wherein when the one interconnection layer formed prior to the remaining interconnection layers is the source line, and the source line is perpendicular to the bit line, the dummy line is a dummy metal line.

13. The resistive memory device according to claim 12, wherein the bit line and the dummy metal line have resistances that are lower than a resistance of the source line.

14. The resistive memory device according to claim 9, wherein when the one interconnection layer formed prior to the remaining interconnection layers is the bit line, and the bit line is perpendicular to the source line, the dummy line is a dummy metal line.

15. The resistive memory device according to claim 14, wherein the source line and the dummy metal line have resistances that are lower than a resistance of the bit line.

16. A resistive memory device comprising:
a cell array comprising a plurality of cell elements each including a plurality of interconnection layers, the plurality of interconnection layers including upper interconnection layers and lower interconnection layers; and
at least one dummy line coupled to at least one of the upper interconnection layers or at least one of the lower interconnection layers via a dummy contact;
wherein the at least one dummy line has a lower resistance than a resistance of the at least one upper interconnection layer or the at least one lower interconnection layer.

17. The resistive memory device of claim 16, wherein the upper interconnection layers comprise at least one bit line, and the lower interconnection layers comprise at least one source line.

18. The resistive memory device of claim 17, wherein the at least one dummy line has a same line width as a line width of the at least one bit line.

19. The resistive memory device of claim 17, wherein the at least one dummy bit line has a lower resistance than a resistance of the at least one source line.

20. The resistive memory device of claim 16, wherein the dummy contact is formed at an edge of the cell array.

* * * * *